United States Patent
Albert et al.

(10) Patent No.: US 11,092,514 B2
(45) Date of Patent: Aug. 17, 2021

(54) SENSOR DOME ARRANGEMENT

(71) Applicant: CONTI TEMIC MICROELECTRONIC GMBH, Nuremberg (DE)

(72) Inventors: Andreas Albert, Hoechstadt/Aisch (DE); Joachim Buhl, Nuremberg (DE); Turhan Bueyuekbas, Fuerth (DE); Andreas Plach, Forchheim (DE); Matthias Wieczorek, Neunkirchen am Sand (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 295 days.

(21) Appl. No.: 15/766,919

(22) PCT Filed: Sep. 9, 2016

(86) PCT No.: PCT/EP2016/071372
§ 371 (c)(1),
(2) Date: Apr. 9, 2018

(87) PCT Pub. No.: WO2017/060040
PCT Pub. Date: Apr. 13, 2017

(65) Prior Publication Data
US 2018/0299348 A1 Oct. 18, 2018

(30) Foreign Application Priority Data

Oct. 9, 2015 (DE) ..................... 10 2015 219 571.6

(51) Int. Cl.
*G01M 15/02* (2006.01)
*H05K 5/00* (2006.01)
(Continued)

(52) U.S. Cl.
CPC .......... *G01M 15/02* (2013.01); *H05K 5/0069* (2013.01); *H05K 5/0082* (2013.01); *H05K 5/061* (2013.01);
(Continued)

(58) Field of Classification Search
CPC ..... G01M 15/02; H05K 5/0069; H05K 5/061; H05K 5/0082; H05K 5/065; H01R 4/2404;
(Continued)

(56) References Cited

U.S. PATENT DOCUMENTS 4,939,928 A * 7/1990 Carle ..................... G01R 31/54
73/115.02
5,955,656 A 9/1999 Graser et al.
(Continued)

FOREIGN PATENT DOCUMENTS

CN 1181812 A 5/1998
CN 101543153 A 9/2009
(Continued)

*Primary Examiner* — Peter J Macchiarolo
*Assistant Examiner* — Anthony W Megna Fuentes
(74) *Attorney, Agent, or Firm* — Laurence A. Greenberg; Werner H. Stemer; Ralph E. Locher

(57) ABSTRACT

A sensor dome arrangement has a sensor dome and a housing wall, which is particularly a transmission wall. The sensor dome includes a sensor, dome contacts which are electrically connected to the sensor, and a dome housing. The dome housing has a first dome housing section in which the sensor is arranged, and a second dome housing section on or in which the dome contacts are arranged. A through-opening is made in the housing wall, and the sensor dome is attached to the housing wall such that at least one outer surface of the first dome housing section faces a first chamber which is adjacent to the sensor dome and an inner side of the housing wall, and such that the dome contacts (Continued)

face a second chamber which is adjacent to the sensor dome and an outer side of the housing wall.

21 Claims, 1 Drawing Sheet

(51) Int. Cl.
 *H05K 5/06* (2006.01)
 *H01R 4/2404* (2018.01)
(52) U.S. Cl.
 CPC ........ *H01R 4/2404* (2013.01); *H01R 2201/26* (2013.01); *H05K 5/065* (2013.01)
(58) Field of Classification Search
 CPC .. H01R 12/55; H01R 13/5202; H01R 13/748; H01R 2201/26
 See application file for complete search history.

(56) References Cited

U.S. PATENT DOCUMENTS

| | | | |
|---|---|---|---|
| 6,405,593 | B1 | 6/2002 | Palfenier et al. |
| 7,059,214 | B2 | 6/2006 | Murakami et al. |
| 7,373,826 | B2 | 5/2008 | Weber et al. |
| 7,600,443 | B2 | 10/2009 | Ott |
| 7,918,691 | B2 | 4/2011 | Assel et al. |
| 7,965,075 | B2 | 6/2011 | Mueller et al. |
| 8,029,188 | B2 | 10/2011 | Park |
| 8,286,469 | B2 | 10/2012 | Karrer et al. |
| 8,357,073 | B2 | 1/2013 | Iwase et al. |
| 8,396,631 | B2 | 3/2013 | Bueyuekbas et al. |
| 9,653,835 | B2 | 5/2017 | Kortlang |
| 9,689,718 | B2 | 6/2017 | Krauer et al. |
| 2005/0028624 | A1* | 2/2005 | Murakami ............ F16H 59/105 74/335 |
| 2007/0176593 | A1 | 8/2007 | Fathauer |
| 2007/0176595 | A1 | 8/2007 | Fathauer |
| 2014/0187106 | A1 | 7/2014 | Yamamoto |
| 2014/0232039 | A1 | 8/2014 | Minematsu et al. |
| 2017/0159800 | A1 | 6/2017 | Gebhardt et al. |

FOREIGN PATENT DOCUMENTS

| | | |
|---|---|---|
| CN | 104379982 A | 2/2015 |
| DE | 19612579 A1 | 10/1997 |
| DE | 19649914 A1 | 6/1998 |
| DE | 19818507 A1 | 10/1999 |
| DE | 10116509 A1 | 10/2001 |
| DE | 10031167 A1 | 1/2002 |
| DE | 102004002034 A1 | 8/2005 |
| DE | 102005040169 A1 | 3/2007 |
| DE | 102005043413 A1 | 3/2007 |
| DE | 102006008752 A1 | 9/2007 |
| DE | 102008008336 A1 | 9/2008 |
| DE | 102008014457 A1 | 9/2008 |
| DE | 102007025859 A1 | 12/2008 |
| DE | 102007025890 A1 | 12/2008 |
| DE | 102008004504 A1 | 12/2008 |
| DE | 102007059944 A1 | 1/2009 |
| DE | 202008016215 U1 | 5/2010 |
| DE | 102010005023 A1 | 7/2011 |
| DE | 102010046357 A1 | 3/2012 |
| DE | 102010042002 A1 | 4/2012 |
| DE | 102012110597 A1 | 5/2013 |
| DE | 102011088037 A1 | 6/2013 |
| DE | 102012214317 A1 | 2/2014 |
| DE | 102012112737 A1 | 4/2014 |
| DE | 102013217472 A1 | 5/2014 |
| DE | 102012112872 A1 | 7/2014 |
| DE | 102013201424 A1 | 7/2014 |
| DE | 102013212940 A1 | 12/2014 |
| DE | 102013015593 A1 | 4/2015 |
| DE | 102013224836 A1 | 6/2015 |
| DE | 102013226394 A1 | 6/2015 |
| DE | 102014202354 A1 | 8/2015 |
| DE | 102014205385 A1 | 9/2015 |
| DE | 102014216585 A1 | 9/2015 |
| DE | 102014213680 A1 | 1/2016 |
| DE | 102014217556 A1 | 3/2016 |
| EP | 0845922 A2 | 6/1998 |
| EP | 2122784 B1 | 1/2014 |
| JP | 2002190345 A | 7/2002 |
| JP | 2002250430 A | 9/2002 |
| JP | 2004351801 A | 12/2004 |
| JP | 2007071856 A | 3/2007 |
| JP | 2009035053 A | 2/2009 |

* cited by examiner

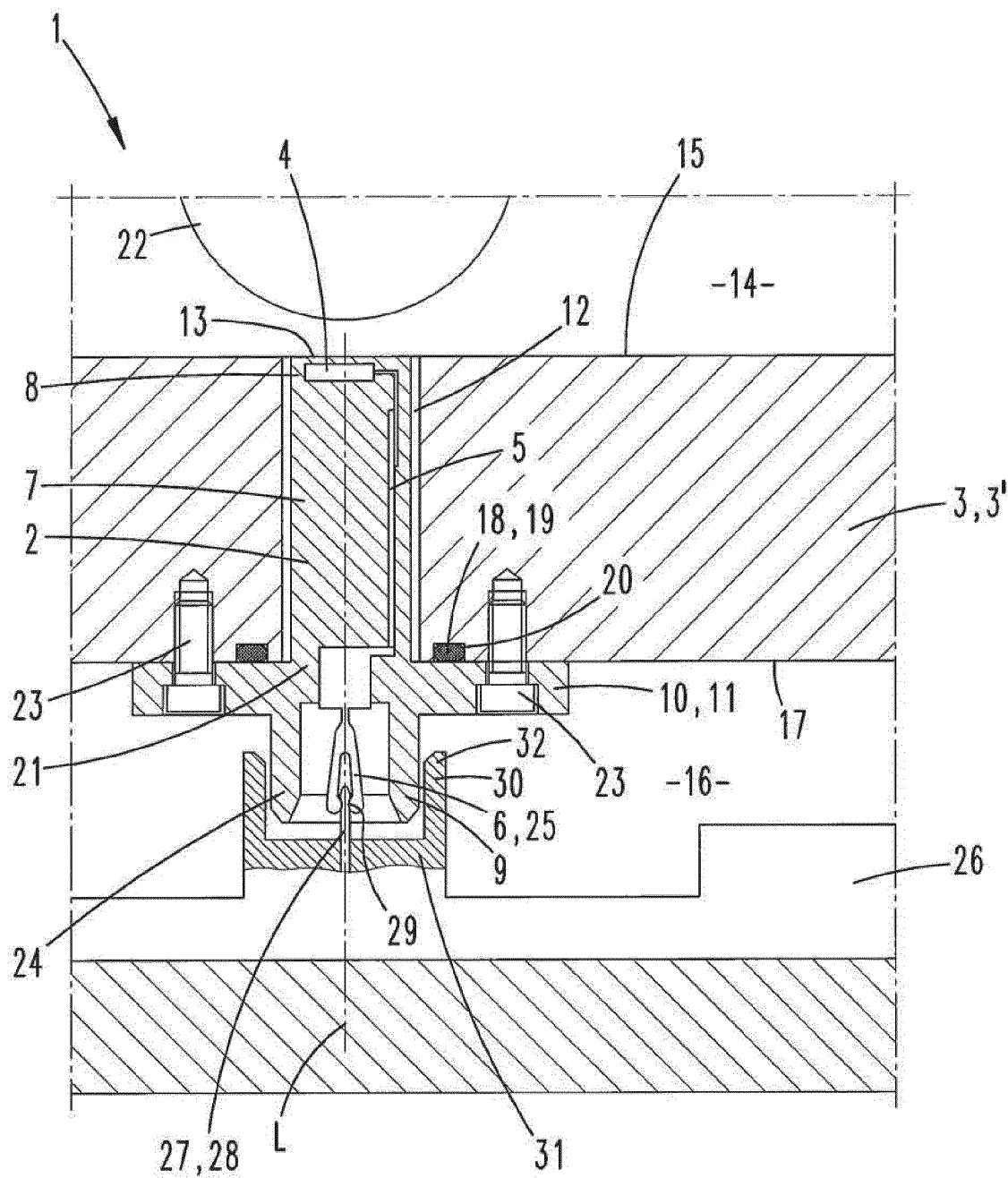

SENSOR DOME ARRANGEMENT

FIELD OF THE ART

The present invention relates to a sensor dome arrangement comprising a sensor dome and a housing wall, which is particularly a transmission wall wherein the sensor dome has a sensor, dome contacts which are electrically connected to the sensor, and a dome housing, wherein the dome housing has a first dome housing section, in which the sensor is arranged, and a second dome housing section, on or in which the dome contacts are arranged.

PRIOR ART

Sensor dome arrangements according to the generic term are used e.g. in transmissions of motor vehicles in order to arrange sensors in the interior of a transmission chamber which is subjected to an oil atmosphere, at desired positions which are spaced apart from the electrical circuit. For example, sensor domes are known with rotational speed sensors or with gear actuator sensors. It is customary here to arrange the control electronics which are connected to one or more sensor domes together with the sensor domes in the interior of a transmission chamber which is subjected to transmission oil or other transmission media, such that the electronic circuit is subjected to the transmission oil or the transmission media. On the other hand, in the past the requirements of motor vehicle manufacturers with respect to the robustness of a control system in the engine compartment and in the transmission have continuously increased. These requirements also include improved protection and higher resistance of electronic control systems to chemical attacks of aggressive media and oils in the transmission or engine compartment.

SUMMARY OF THE INVENTION

Against this background, the invention is based on the object of advantageously developing a sensor dome arrangement of the generic type. In particular, the aim is to be able to avoid individual disadvantages or multiple instances of the disadvantages specified above.

In order to achieve this object, the invention proposes that a through-opening is formed in the housing wall, in that the sensor dome is attached to the housing wall, such that at least one outer surface of the first dome housing section faces a first chamber which is adjacent to the sensor dome and to an inner side of the housing wall, and such that the dome contacts face a second chamber which is adjacent to the sensor dome and to an outer side of the housing wall.

The first chamber can preferably be an interior of the transmission in which e.g. gear wheels which are lubricated with transmission oil are located, and the second chamber can be a receptacle chamber, separated from the transmission wall and the sensor dome arrangement in a sealed fashion, for an electronic circuit (the term control electronics can be used instead of electronic circuit). A sensor dome arrangement according to the invention permits a sensor to be positioned at a desired position which can either be, for example, within the housing wall or in the interior of the transmission chamber, while the electronic circuit which is connected to the sensor can be arranged outside the interior of the transmission, in another chamber which is preferably sealed, that is to say protected, with respect to oil and other aggressive transmission media. This can prevent the control electronics from being permanently located in an aggressive medium, as in the past. This permits resistance against chemical attacks and increases the robustness of a control system. At the same time, this improves the maintenance friendliness of the control electronics. Depending on the use or surroundings of the sensor dome arrangement, the term chamber region could be respectively used instead of chamber. Generally, it would also be possible to refer to a first wall side of the housing wall instead of an inner side of the wall, and of a second wall side of the housing wall instead of an outer side of the wall.

There are numerous possible ways of developing a sensor dome arrangement according to the invention in a preferred fashion.

It is preferred that the sensor dome arrangement comprises sealing means, and that the sensor dome and the sealing means are attached to the housing wall to form a closure of the through-opening, such that the sealing means bring about a seal of the closure between the first chamber and the second chamber. The sealing means can be e.g. a separate seal, such as for example an O-ring. There is also the possibility of the sealing means being formed directly on the sensor dome and/or on the housing wall. By bringing about a sealed closure of the through-opening by means of the sensor dome and the sealing means on the housing wall, the protection of a chamber, which is adjacent to the outer side of the wall and is intended, for example, for mounting an electronic control circuit, against transmission oil or other aggressive media can be improved. It is preferred that the sealed closure is embodied in an oil-tight fashion and, in particular, gas-tight fashion.

It is considered to be expedient that the sensor dome arrangement has fastening means, in particular a screw or a plurality of screws, by means of which the sensor dome is fastened to the housing wall.

There is the possibility of the dome housing having a connecting section which is formed between the first dome housing section and the second dome housing section, and which is fastened in a seal-forming fashion to the outer side of the housing wall by means of the fastening means and the sealing means. It is considered to be expedient that the dome housing has plastic or is composed of plastic, wherein the sensor is, in particular, embedded in the plastic. There is the possibility of the sensor being encapsulated by injection molding with plastic on one or more sides, in particular on all its sides. It is considered to be expedient that the connecting section is embodied as a flange, in that, with respect to a longitudinal direction of the sensor dome, the first dome housing section is formed on a first side of the flange and the second dome housing section is formed on a second side of the flange. There is the possibility of the sealing means having a sealing ring, in particular an O-ring which is inserted into a groove formed on the outer side of the wall or in the connecting section.

It is considered expedient that the second dome housing section has a plug wall which proceeds from the flange and extends around the dome contacts, in a closed fashion in a circumferential direction in the manner of a ring. This permits the formation of a plug interface. It is preferred that the dome contacts are embodied as insulation-piercing contacts or as blade contacts.

Depending on the requirements, it may be advantageous if the sensor is arranged, with respect to a longitudinal direction of the sensor dome, at a larger distance than the dome contacts from the sealing means.

There is the possibility of the sensor dome arrangement comprising a control circuit which has circuit contacts, and of circuit contacts being or being able to be connected in an electrically conductive fashion to dome contacts. The control circuit can preferably be a transmission control system or a component of a transmission control system. Instead of a control circuit, the term control electronics or transmission control system could also be used. The control circuit or control electronics can be suitable e.g. for controlling valves used in a transmission.

In a preferred exemplary embodiment, there is the possibility of the dome contacts and the circuit contacts being designed to each bring about an electrically conductive plug-in connection, which is, in particular, a plug-in terminal connection, between one dome contact in each case and one circuit contact in each case. If one dome contact is formed in each case with one circuit contact in each case, a plug-in terminal connection is formed, this provides not only an electrical connection but at the same time also mechanical fastening. The clamping force which is effective between the dome contact and the circuit contact prevents undesired release of the connection. It is preferred that dome contacts are embodied as insulation-piercing contacts and circuit contacts are embodied as blade contacts. Alternatively, it would be possible for dome contacts to be embodied as blade contacts and circuit contacts to be embodied as insulation-piercing contacts. Installation-piercing contact arrangements have the advantageous property of multiple-pluggability A considerable application in transmissions are, for example, plug-in systems for valves. Mounting a transmission control system on a housing wall or transmission wall, which could, for example, be pre-mounted on a hydraulic component, is also conceivable as an application. During the mounting of the transmission control system on the transition component, at the same time a mechanical plug-in connection and at the same time the electrical connection of the control electronics to the sensor dome can be produced. The insulation-piercing contact system can be configured in such a way that contact coverage is present with all possibly occurring tolerances.

There is the possibility of the housing wall having a plurality of through-openings, in that the sensor dome arrangement comprises a plurality of sensor domes and a plurality of sealing means, wherein in each case one sensor dome is attached to the housing wall in the region of, in each case, one through-opening, such that at least one outer surface of its first dome housing section faces a first chamber which is adjacent to the sensor dome and to an inner side of the housing wall, and such that the dome contacts face a second chamber which is adjacent to the sensor dome and to an outer side of the housing wall, and in that the respective sensor dome and sealing means are attached to the housing wall to forma closure of the respectively applicable through-opening, such that the sealing means bring about a seal of the closure between the first chamber and the second chamber.

There is also the possibility of each sensor dome which is connected to the control circuit being connected or being able to be connected to the control circuit by means of an, in particular, detachable, electrical plug-in connection. In this respect, the invention also proposes a, in particular integrated, control electronics which interacts with sensor domes but in which none of the sensor domes is connected in a non-detachable fashion to the control electronics. As result of the plug-in connections which are preferred by the invention, the sensor domes can be separated from the control electronics, as result of which the maintenance friendliness and resistance to media can be increased.

It is preferred that the housing wall is an outer wall of the transmission, that the first chamber is an interior of the transmission, in which gear wheels are located, and that the second chamber is sealed overall by the first chamber. The second chamber can preferably be in this respect an oil-free chamber for the installation of integrated transmission control electronics.

The dome contacts and the circuit contacts are manufactured from electrically conductive material, they can preferably be composed of brass.

It is preferred that the circuit contacts lead from the control circuit into a plug which has a plug base and a plug collar which proceeds from the plug base, wherein the plug collar is closed along a plug circumference, in particular at the circumference, wherein the circuit contacts protrude beyond the plug base, and wherein the plug collar and the plug wall overlap one another in a plugging direction of the electrical plug-in connection. If the housing wall is a transmission wall it is preferred that the control circuit is an electronic circuit which is suitable for performing open-loop and/or closed-loop control of a transmission or is adapted thereto.

The invention can provide various technical advantages depending on the preferred embodiment. In the case of servicing intervals of vehicles in workshops, all the sensor domes can be selectively replaced with newer sensor domes. There is also the possibility of replacing a transmission control system which is integrated into the so-called second chamber, without the sensor domes having to be replaced. It is also possible to modernise transmission platforms by replacing sensor domes of relatively old generations with relatively new ones. The transmission control electronics could be modernised by a software update. A transmission control system can cover multiple transmission platforms simultaneously. Plug-in interfaces permit the use of locally offset sensor domes in the transmission. A seal with a sealing means on the sensor dome can protect the transmission control electronics and the plug interface particularly effectively against aggressive chemical reaction partners in the oil, against oil vapors, against hot sprayed oil in the transmission and against residual dirt as result of abrasion in the transmission.

BRIEF DESCRIPTION OF THE DRAWING

The invention will be described below with reference to the appended FIGURE which shows a preferred exemplary embodiment. In the drawings:

The FIGURE shows a sectional view of an exemplary embodiment of a sensor dome arrangement according to the invention, wherein adjacent components are also partially shown in the detail in the FIGURE.

DESCRIPTION OF THE EMBODIMENTS

The sensor dome arrangement 1 shown by way of example comprises a sensor dome 2 and a housing wall 3, which in the example is a transmission wall 3' specifically an outer wall of a transmission. The sensor dome 2 has a sensor 4 and multiple electrically conductive dome contacts 6 for forming contact with an electronic circuit, wherein the dome contacts 6 are connected to the sensor 4 by means of one electrical conductor 5 in each case. The sensor dome which is denoted in its entirety by 2 has a dome housing 7. The latter comprises in its overall single-part design a first dome housing section 8 in which the sensor 4 is arranged, a second dome housing section 9 in which the dome contacts 6 are arranged, and a third dome housing section 10 which is arranged between the dome housing sections 8, 9 in relation to a longitudinal direction L of the sensor dome 2 and which is also referred to as a connecting section 11. The sensor 4 is connected to a plurality of dome contacts 6, wherein in each case only one dome contact 6 and one conductor 5 are shown in the sectional plane in FIG. 1. A through-opening 12 is formed in the transmission wall 3'. The sensor dome 2 is embodied and attached to the transmission wall 3' in such a way that an end-side outer surface 13 of the first dome housing section 8 faces a first chamber 14 which is adjacent to the sensor dome 2 and to an inner side 15 of the transmission wall 3, and such that the dome contacts 6 face a second chamber 16 which is adjacent to the sensor dome 2 and to an outer side 17 of the transmission wall 3'. In addition to the end-side outer surface 13, the first dome housing section 8 has a lateral outer surface. The second chamber 16 extends underneath the housing wall 3 and the sensor dome 2 in FIG. 1. The sensor dome arrangement 1 comprises an O-ring 19 as the sealing means 18. In the example, a groove 20 which surrounds the through-opening and into which the O-ring 19 is inserted is introduced into the outer side 17 of the wall. The third dome housing section 10 which is embodied as a flange in the example and which forms a connecting section 11 is fitted against the outer side 17 of the wall and overlaps the O-ring 19. It becomes clear from the FIGURE that the sensor dome 2 and the O-ring 19 are attached to the transmission wall 3' to form a closure 21 of the through-opening 12. In this context, the O-ring 19 brings about a seal of the closure 21 between the first chamber 14 and the second chamber 16.

In the example, the first chamber 14 is the interior of a transmission in which, inter alia, a gear wheel 22 is located. In the example, the second chamber 16 is sealed by the first chamber 40 not only by means of the sensor dome 2 and the O-ring 19 but also, for that matter, completely, such that it does not come into contact with media, such as for example oil, present in the interior of the first chamber 14. Correspondingly, the closure which is brought about by means of the sensor dome 2 and the O-ring 19 is also embodied in an oil-tight fashion.

The sensor dome arrangement 1 comprises fastening means 23, which in the example are screws by means of which the connecting section 11 is fastened to the transmission wall 3'. In the example, the dome housing 7 is manufactured from plastic, wherein the sensor 4 is embedded in the plastic.

In the example, the second dome housing section 9 forms a plug wall 24 which proceeds from the connecting section 11 which is embodied as a flange and which extends around the dome contacts 6 in a closed fashion in a circumferential direction. In the example, the dome contacts 6 are embodied as insulation-piercing contacts 25. In the examplary embodiment shown, the sensor dome arrangement 1 comprises a control circuit 26 which is shown only schematically. The latter can have control electronics for performing open-loop and/or closed-loop control of the transmission. The control circuit 26 comprises circuit contacts 27, only one circuit contact 27 of which is illustrated in the sectional plane in FIG. 1. The circuit contacts 27 are connected in an electrically conductive fashion to the dome contacts 6. In the example, the dome contacts 6 are embodied as blade contacts 28. In order to electrically connect the sensor dome 2 to the control circuit 26, the insulation-piercing contacts 25 can be plugged onto one blade contact 28 each, such that in each case an electrically conductive plug-in connection 29 results. The dome contacts 6 and the circuit contacts 27 can be manufactured, for example, from brass or from some other metal. During the plugging on process, the two limbs of an insulation-piercing contact 25 are bent over elastically outward, such that they apply a clamping force to the blade contact 28. In this respect, the plug-in connection 29 is an installation-piercing connection.

In the example there is provision that the circuit contacts 27 lead from the control circuit 26 into a plug 30. Said plug 30 has a plug base 31 and a plug collar 32 proceeding therefrom. The plug collar 32 extends along a plug circumference, in a closed fashion on the circumference. The circuit contacts 26 protrude beyond the plug base 31. The plug collar 32 and the plug wall 24 overlap one another in a plugging direction of the electrical plug-in connection 29, that is to say in a direction parallel to the longitudinal direction L. In the example, the control circuit 26 is an electronic control system which is suitable for performing open-loop and/or closed-loop control of a transmission.

All the disclosed features are essential to the invention (on their own, but also in combination with one another). The subclaims characterize with their features independent inventive developments of the prior art, in particular in order to carry out divisional applications on the basis of these claims.

LIST OF REFERENCE SYMBOLS

1 Sensor dome arrangement
2 Sensor dome
3 Housing wall
3' Transmission wall
4 Sensor
5 Conductor
6 Dome contact
7 Dome housing
8 First dome housing section
9 Second dome housing section
10 Third dome housing section
11 Connecting section
12 Through-opening
13 Outer surface
14 First chamber
15 Inner side of wall
16 Second chamber
17 Outer side of wall
18 Sealing means
19 O-ring
20 Groove
21 Closure
22 Gear wheel
23 Fastening means
24 Plug wall
25 Insulation-piercing contact
26 Control circuit
27 Circuit contact
28 Blade contact
29 Plug-in connection
30 Plug
31 Plug base
32 Plug collar
L Longitudinal direction

The invention claimed is:

1. A sensor dome arrangement, comprising:
a housing wall having an inner side and an outer side located opposite said inner side, said housing wall having a dome through-opening formed therein and extending between said inner side and said outer side;
a sensor dome attached to said housing wall and projecting in said dome through-opening, said sensor dome having a dome housing with a first dome housing section and a second dome housing section, said sensor dome including a sensor disposed in said first dome housing section and dome contacts disposed in said second dome housing section and electrically connected to said sensor; and a seal;

said first dome housing section having an outer surface facing toward a first chamber adjoining said sensor dome and said inner side of said housing wall, and said dome contacts facing toward a second chamber adjoining said sensor dome and said outer side of said housing wall;

said housing wall being an outer wall of a transmission, and said first chamber being an interior of the transmission, in which gear wheels are located;

said dome housing having a connecting section being a flange formed between said first dome housing section and said second dome housing section;

said flange extending along said housing wall in said second chamber;

wherein said flange is confined within said second chamber and said flange is fastened to said housing wall;

wherein said seal is located between said housing wall and said flange that is confined within said second chamber; and wherein only said sensor dome is present in said dome through-opening.

2. The sensor dome arrangement according to claim 1, wherein said sensor dome and said seal are attached to said housing wall to form a closure of said dome through-opening, and wherein said seal seals a closure between said first chamber and said second chamber.

3. The sensor dome arrangement according to claim 2, wherein said sealed closure forms an oil-tight seal.

4. The sensor dome arrangement according to claim 3, wherein said sealed closure forms a gas-tight seal.

5. The sensor dome arrangement according to claim 2, wherein said sensor is disposed, with respect to a longitudinal direction of said sensor dome, at a greater distance from said seal than said dome contacts.

6. The sensor arrangement according to claim 2, wherein:
said housing wall is formed with a plurality of through-openings, said sensor dome is one of a plurality of sensor domes, and said seal is one of a plurality of seals;
each one of said sensor domes is attached to said housing wall at a respective one of said through-openings, such that at least one outer surface of said first dome housing section faces said first chamber that adjoins said sensor dome and said inner side of said housing wall, and such that said dome contacts face said second chamber that adjoins said sensor dome and said outer side of said housing wall; and
the respective said sensor dome and said seal are attached to said housing wall to form a closure of the respective said through-opening, such that said seal seals the closure between said first chamber and said second chamber.

7. The sensor dome arrangement according to claim 6, wherein each said sensor dome is connected to a control circuit or is to be connected to said control circuit by way of an electrical plug-in connection.

8. The sensor dome arrangement according to claim 1, which further comprises a fastening device for fastening said sensor dome to said housing wall.

9. The sensor dome arrangement according to claim 8, wherein said connecting section is fastened to form a seal to said outer side of said housing wall by way of said fastening device and said seal.

10. The sensor dome arrangement according to claim 9, wherein with respect to a longitudinal direction of said sensor dome, said first dome housing section is formed on a first side of said flange and said second dome housing section is formed on a second side of said flange.

11. The sensor dome arrangement according to claim 10, wherein said second dome housing section has a plug wall which proceeds from said flange and extends around said dome contacts, and is circumferentially closed in a ring shape.

12. The sensor dome arrangement according to claim 9, wherein said seal has a sealing ring inserted into a groove formed on an outer side of said wall or in said connecting section.

13. The sensor dome arrangement according to claim 1, wherein said dome housing comprises plastic or consists of plastic and said sensor is embedded in said plastic.

14. The sensor dome arrangement according to claim 1, wherein said dome contacts are insulation-piercing contacts or blade contacts.

15. The sensor dome arrangement according to claim 1, which further comprises a control circuit having circuit contacts to be electrically connected to said dome contacts.

16. The sensor dome arrangement according to claim 15, wherein said dome contacts and said circuit contacts are configured to bring about an electrically conductive plug-in connection, formed as a plug-in terminal connection between one dome contact each and one circuit contact each.

17. The sensor dome arrangement according to claim 15, wherein said dome contacts and said circuit contacts are constructed in a manner selected from the group consisting of:
group 1) said dome contacts are insulation-piercing contacts and said circuit contacts are blade contacts; and
group 2) said dome contacts are blade contacts and said circuit contacts are insulation-piercing contacts.

18. The sensor dome arrangement according to claim 15, wherein said second dome housing section has a plug wall which proceeds from said flange and extends around said dome contacts, and is circumferentially closed in a ring shape, wherein said circuit contacts lead from said control circuit into a plug which has a plug base and a plug collar that proceeds from said plug base, wherein said plug collar is closed along a plug circumference, wherein said circuit contacts protrude beyond said plug base, and wherein said plug collar and said plug wall overlap one another in a plugging direction of an electrical plug-in connection formed by said circuit contacts and said dome contacts.

19. The sensor dome arrangement according to claim 15, wherein said control circuit is an electronic circuit configured for performing open-loop and/or closed-loop control of the transmission.

20. The sensor dome arrangement according to claim 1, wherein said second chamber is sealed overall from said first chamber.

21. A sensor dome arrangement, comprising:
a housing wall having an inner side and an outer side located opposite said inner side, said housing wall having a dome through-opening formed therein and extending between said inner side and said outer side;
a sensor dome attached to said housing wall and projecting in said dome through-opening, said sensor dome having a dome housing with a first dome housing section and a second dome housing section, a sensor disposed in said first dome housing section and dome contacts disposed in said second dome housing section and electrically connected to said sensor; and a seal;

said first dome housing section having an outer surface facing toward a first chamber adjoining said sensor dome and said inner side of said housing wall, and said dome contacts facing toward a second chamber adjoining said sensor dome and said outer side of said housing wall;

said housing wall being an outer wall of a transmission, and said first chamber being an interior of the transmission, in which gear wheels are located;

said dome housing having a connecting section being a flange formed between said first dome housing section and said second dome housing section;

said flange extending along said housing wall in said second chamber;

wherein said sensor dome and said seal are attached to said housing wall to form a closure of said dome through-opening, and wherein said seal seals a closure between said first chamber and said second chamber;

wherein said housing wall is formed with a plurality of through-openings, said sensor dome is one of a plurality of sensor domes, and said seal is one of a plurality of seals;

wherein each one of said sensor domes is attached to said housing wall at a respective one of said through-openings, such that at least one outer surface of said first dome housing section faces said first chamber that adjoins said sensor dome and said inner side of said housing wall, and such that said dome contacts face said second chamber that adjoins said sensor dome and said outer side of said housing wall;

wherein the respective said sensor dome and said seal are attached to said housing wall to form a closure of the respective said through-opening, such that said seal seals the closure between said first chamber and said second chamber; and wherein each said sensor dome is connected to a control circuit or is to be connected to said control circuit by way of an electrical plug-in connection.

* * * * *